(12) United States Patent
Fukuda (10) Patent No.: US 6,746,905 B1
(45) Date of Patent: Jun. 8, 2004

(54) THIN FILM TRANSISTOR AND MANUFACTURING PROCESS THEREFOR

(75) Inventor: Kaichi Fukuda, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 434 days.

(21) Appl. No.: 09/635,061

(22) Filed: Aug. 9, 2000

Related U.S. Application Data (62) Division of application No. 08/879,515, filed on Jun. 20, 1997, now abandoned.

(30) Foreign Application Priority Data

Jun. 20, 1996 (JP) .............................................. 8-159682

(51) Int. Cl.⁷ .............................................. H01L 21/00
(52) U.S. Cl. ...................... 438/164; 438/216; 438/287; 438/591
(58) Field of Search .......................... 438/59, 149–166, 438/287, 591, 216; 257/57, 61

(56) References Cited

U.S. PATENT DOCUMENTS

| | | | |
|---|---|---|---|
| T938,004 I4 | | 9/1975 | Lehman ...................... 257/411 |
| 4,523,963 A | * | 6/1985 | Ohta et al. .................. 438/162 |
| 4,727,044 A | | 2/1988 | Yamazaki .................... 438/166 |
| 4,758,529 A | * | 7/1988 | Ipri ............................. 438/165 |
| 4,943,837 A | | 7/1990 | Konishi et al. ............... 257/57 |
| 4,950,618 A | * | 8/1990 | Sundaresan et al. ........ 438/517 |
| 4,954,855 A | | 9/1990 | Mimura et al. ............... 257/61 |
| 5,120,667 A | * | 6/1992 | Tarui et al. .................. 438/164 |
| 5,166,757 A | | 11/1992 | Kitamura et al. ............. 257/53 |
| 5,166,816 A | | 11/1992 | Kaneko et al. ............... 257/59 |
| 5,191,453 A | | 3/1993 | Okumura ..................... 359/59 |
| 5,292,675 A | * | 3/1994 | Codama ....................... 438/163 |
| 5,317,436 A | | 5/1994 | Spitzer et al. .................. 349/5 |
| 5,402,141 A | | 3/1995 | Haim et al. ................... 345/88 |
| 5,473,168 A | | 12/1995 | Kawai et al. ................. 257/61 |
| 5,569,936 A | | 10/1996 | Zhang et al. .................. 257/66 |
| 5,574,293 A | | 11/1996 | Arai et al. .................... 257/59 |
| 5,614,730 A | | 3/1997 | Nakazawa et al. ............ 257/59 |
| 5,641,974 A | | 6/1997 | Den Boer et al. ............. 257/59 |
| 5,646,424 A | * | 7/1997 | Zhang et al. .................. 257/66 |
| 5,648,662 A | | 7/1997 | Zhang et al. .................. 257/59 |
| 5,648,674 A | | 7/1997 | Weisfeld et al. ............. 257/428 |
| 5,677,206 A | * | 10/1997 | Lee et al. ..................... 438/163 |
| 5,693,546 A | * | 12/1997 | Nam et al. ................... 438/163 |
| 5,698,882 A | | 12/1997 | Park ............................ 257/344 |
| 5,773,844 A | | 6/1998 | Kawamura et al. ........... 257/57 |
| 5,821,559 A | * | 10/1998 | Yamazaki et al. ............. 257/57 |
| 5,851,860 A | * | 12/1998 | Makita et al. ............... 438/166 |
| 5,889,292 A | | 3/1999 | Sameshima et al. .......... 257/65 |
| 5,932,484 A | * | 8/1999 | Iwanaga et al. ............. 438/689 |
| 5,989,945 A | * | 11/1999 | Yudasaka et al. ........... 438/149 |
| 6,060,725 A | * | 5/2000 | Zhang et al. .................. 257/66 |
| 6,077,730 A | * | 6/2000 | Lee et al. ..................... 438/149 |

* cited by examiner

*Primary Examiner*—Allan R. Wilson
*Assistant Examiner*—Paul E Brock, II
(74) *Attorney, Agent, or Firm*—Pillsbury Winthrop LLP (57) ABSTRACT

An object of this invention is to provide a manufacturing process and structure of a thin film transistor having high productivity in which the resistance of a gate electrode wiring line can be decreased, an active layer and source and drain electrodes form an ohmic contact, and the number of masks required in the manufacturing process can be decreased. An amorphous silicon layer and a 1-st gate dielectric layer are consecutively deposited on an insulating substrate by plasma CVD. The 1-st gate dielectric layer is processed together with the amorphous silicon layer into an island shape. A 2-nd gate dielectric layer and a metal interconnection layer are deposited on the 1-st gate dielectric layer. After the metal interconnection layer is etched to form a gate electrode, the 2-nd and 1-st gate dielectric layers are etched to pattern the gate dielectric layer. Using the gate electrode as a mask, ion doping and laser irradiation are performed for the portion, of the amorphous silicon layer, that was exposed in the previous step. This portion is poly-crystallized to form source and drain regions.

6 Claims, 6 Drawing Sheets

THIN FILM TRANSISTOR AND MANUFACTURING PROCESS THEREFOR

This is a division of application Ser. No. 08/879,515, filed Jun. 20, 1997 now abandoned.

BACKGROUND OF THE INVENTION

The present invention relates to the structure of a thin film transistor used as, e.g., the switching element of a liquid crystal display, and a manufacturing process therefor, and relates to a thin film transistor array using a thin film transistor with the above structure, and the structure of an active matrix liquid crystal display.

An active matrix liquid crystal display using a twisted nematic (TN) liquid crystal has excellent characteristics such as a large capacity and a high density, and is widely used for a television image display, a graphic display, and the like.

To provide a high-contrast display free from any crosstalk, such an active matrix liquid crystal display employs a scheme of driving and controlling each pixel by using a semiconductor switching element. The semiconductor switching element for this application is often a thin film transistor (TFT) in which a semiconductor active layer (channel, source, and drain regions) is formed of amorphous silicon (a-Si) on a glass substrate because it is capable of transmission type display and its area can be relatively easily increased.

Generally known structures of such amorphous silicon TFTs are an inverted staggered TFT in which the gate electrode is arranged below the amorphous silicon layer serving as an active layer, a staggered TFT in which the gate electrode is arranged above the amorphous silicon layer.

Of these structures, the inverted staggered TFT has good transistor characteristics. However, since the gate electrode is arranged underneath the amorphous silicon layer, the resistance of the gate electrode wiring line (scanning line) is difficult to decrease. When a TFT is applied to an active matrix liquid crystal display, of the constituent elements of the TFT, the gate electrode wiring line needs to have low resistance. This problem becomes more serious when the LCD is large in size. As for the productivity, 6 or more photomasks are normally required for the inverted staggered structure, so a cost reduction is difficult to attain.

In the staggered TFT, the gate electrode is arranged above the amorphous silicon layer (top gate type), and the source and drain electrodes are arranged below the amorphous silicon layer. The staggered TFT is advantageous in terms of the productivity and the manufacturing cost because the number of photomasks can be minimized to 2. In addition, since the staggered TFT is of the top gate type, Al can be used as the material of the gate electrode wiring line and it is easy to form a thick film.

However, this conventional staggered structure also has the following problems. First, it is difficult to obtain an ohmic contact between $n^+$ a-Si formed on the source and drain electrodes and a-Si of the active layer, therefore a sufficient ON current cannot be ensured for the TFT. Although it has been proposed to use ITO (Indium Tin Oxide) for the source and drain electrodes and to process the ITO surface with a $PH_3$ plasma before formation of a-Si, the a-Si layer formed subsequently is adversely affected due to contamination with P. In addition, since the source and drain electrodes overlap the gate electrode, the parasitic capacitances between the gate and source and between the gate and drain increase.

U.S. Pat. No. 4,727,044 discloses the following process for manufacturing a top gate TFT. That is, an amorphous silicon layer is formed on a glass substrate, and a gate electrode is formed on this amorphous silicon layer via a gate dielectric layer. Using this gate electrode as a mask, ion doping and laser irradiation are performed for the amorphous silicon layer at portions corresponding to source and drain regions to crystallize the amorphous silicon layer in the regions. The amorphous silicon layer at a portion masked by the gate electrode constitutes a channel. When this process is used to manufacture a coplanar type TFT which is one of top gate TFTs and employed in a monocrystalline silicon LSI, the following process is further performed. The gate electrode and the source and drain regions are covered with an insulating protective layer, a contact hole is formed in this insulating protective layer, and source and drain electrodes are formed.

However, the above TFT structure disclosed in U.S. Pat. No. 4,727,044 has the following problems.

In an application to a liquid crystal display, the amorphous silicon layer must be processed into an island shape, and the semiconductor layer must be isolated between adjacent TFTs. In this case, the amorphous silicon layer is processed into an island shape before formation of a gate dielectric layer. However, a clean interface (channel interface) between the amorphous silicon layer and the gate dielectric layer is difficult to provide, so a TFT having high mobility and high reliability cannot be obtained.

In doping ions into the amorphous silicon layer corresponding to the source and drain regions, a very large acceleration voltage is required because the ions are doped through the gate dielectric layer into the underlying amorphous silicon layer. In the process for manufacturing a monocrystalline silicon LSI, ions are normally doped through a gate dielectric layer. Ion doping through the gate dielectric layer is possible because the thickness of the gate dielectric layer is as thin as 50 nm or less. To the contrary, in a TFT used for a liquid crystal display, a gate dielectric layer generally also serves as an interlevel insulating layer between scanning and signal lines in order to decrease the number of steps. To ensure the insulation properties, or to reduce the capacitance at the cross portion between the scanning and signal lines, the thickness of the gate dielectric layer is set to about 200 to 500 nm. With such a thickness, ions cannot reach the amorphous silicon layer even at an ion doping acceleration voltage of 100 kV; in practice, ion doping through the gate dielectric layer is impossible.

In crystallizing the amorphous silicon layer by laser irradiation, if the laser is irradiated through the gate dielectric layer, ablation easily occurs to scatter amorphous silicon along with discharge of a gas, such as hydrogen gas, from the amorphous silicon layer. In addition to ablation, since interference of the laser beam is caused by the dielectric layer on the amorphous silicon layer, the intensity of the laser beam incident on the amorphous silicon layer undesirably changes in correspondence with variations in thickness of the dielectric layer.

As described above, the amorphous silicon layer cannot be stably crystallized by irradiating the laser through the gate dielectric layer.

BRIEF SUMMARY OF THE INVENTION

The present invention has been made in consideration of the above situation, and has as its object to provide a manufacturing process and structure of a thin film transistor having high productivity in which a clean interface can be formed between a channel and a gate dielectric layer, and the resistance of a gate electrode wiring line (scanning line) is easily decreased, a semiconductor active layer and source and drain electrodes reliably form an ohmic contact, and the number of masks required in the manufacturing process can be decreased.

Process for Manufacturing Thin Film Transistor

According to the present invention, there is provided a process for manufacturing a thin film transistor, which comprises the steps of:

depositing an amorphous silicon layer on an insulating substrate;

depositing a 1-st gate dielectric layer consecutively to the step of depositing the amorphous silicon layer;

patterning the amorphous silicon layer together with the 1-st gate dielectric layer into an island shape;

depositing a 2-nd gate dielectric layer to cover the 1-st gate dielectric layer patterned into the island shape;

depositing a conductive layer on the 2-nd gate dielectric layer;

patterning the conductive layer to form a gate electrode; and doping an impurity ion into the amorphous silicon layer by using the gate electrode as a mask.

According to the thin film transistor manufacturing process of the present invention, the gate dielectric layer is constituted by the 1-st and 2-nd two gate dielectric layers. After the amorphous silicon layer serving as a semiconductor layer is processed together with the 1-st gate dielectric layer into an island shape, they are covered with the 2-nd gate dielectric layer. By employing this step, no patterning step is interposed between deposition of the amorphous silicon layer and deposition of the 1-st gate dielectric layer. The amorphous silicon layer and the 1-st gate dielectric layer can be consecutively deposited by plasma CVD in the same reactive chamber, while maintaining the vacuum state. As a result, a clean interface (channel interface) can be easily obtained between the amorphous silicon layer and the gate dielectric layer. A TFT excellent in characteristics such as high mobility and high reliability can be manufactured.

Since the amorphous silicon layer is processed into an island shape before formation of the gate electrode, semiconductor layers of adjacent TFTs are completely isolated from each other in constituting a TFT array, and no field TFT is formed.

Since the doping element is sufficiently activated due to poly-crystallization by laser irradiation in the source and drain regions formed in self-alignment using the gate electrode as a mask, the resistance of these regions is lower than that of n$^+$ a-Si (n-type amorphous silicon) formed by conventional CVD. For this reason, satisfactory ohmic contact can be ensured between the source region and the source electrode and between the drain region and the drain electrode. As a result, an improvement in TFT characteristics and a reduction in parasitic capacitance, which have been subjects in a TFT with a top gate structure using amorphous silicon for an active layer, can be simultaneously attained.

At least the 2-nd gate dielectric layer is removed by etching using the gate electrode as a mask before the step of doping an impurity ion. With this step, ions can be doped in the amorphous silicon even at a low acceleration voltage.

The 2-nd and 1-st gate dielectric layers are preferably removed by etching using the gate electrode as a mask to expose the surface of the amorphous silicon layer before the step of doping an impurity ion. If a dielectric layer exists on the amorphous silicon layer, the amorphous silicon layer readily causes ablation upon laser irradiation. From this viewpoint, the surface of the amorphous silicon layer is preferably exposed before ion doping.

When silicon nitride is used for the gate dielectric layer, it is etched using the same resist pattern as that used for etching of the gate electrode. At this time, if the gate electrode is side-etched, the gate electrode and the source/drain region are apt to form a short-circuit, or the gate electrode overhanging like a peak may form a shadow in ion doping and laser irradiation to degrade the TFT characteristics. Therefore, side etching must be prevented. Further, etching having a high selectivity must be employed to leave the lower amorphous silicon layer. An effective method which satisfies both the conditions is reactive ion etching using a gas mixture of at least C, H, and F, such as a gas mixture of $CHF_3$ and $O_2$ or a gas mixture of $CF_4$ and $H_2$.

Arrangement of Source and Drain Electrodes

In the thin film transistor manufacturing process of the present invention, the source and drain electrodes can be respectively arranged either below or above the source and drain regions.

In the former case, i.e., when the source electrode is arranged between the source region and the insulating substrate, and the drain electrode is arranged between the drain region and the insulating substrate, the thin film transistor is manufactured by the following process. Prior to deposition of the amorphous silicon layer, the source and drain electrodes are formed to have a larger interval therebetween than the width of the gate electrode to be formed in a subsequent step. After the amorphous silicon layer is deposited, it is poly-crystallized by ion doping and laser irradiation using the gate electrode as a mask. With this process, the channel length is determined in self-alignment with the gate electrode. At this same time, the source and drain electrodes are respectively connected to the low-resistance source and drain regions.

In this case, it is important that the gate dielectric layer and the gate electrode be etched using the same pattern to expose the surface of the amorphous silicon layer before ion doping. This is because an impurity must be deeply doped in the amorphous silicon layer in order to connect the source and drain electrodes to the lower surface of the low-resistance polycrystalline silicon layer.

The material for the source and drain electrodes must be a low-resistance, refractory material so as to resist the high temperature during laser irradiation. From this viewpoint, an MoW alloy and an MoTa alloy are desirable materials which satisfy both the requirements. Particularly, the MoW alloy is more preferable than the MoTa alloy because its resistance is lower.

In the latter case, i.e., when the source and drain electrodes are respectively arranged above the drain and source regions, the thin film transistor is manufactured by the following process. After the gate electrode and 2-nd and 1-st gate dielectric layers are patterned, similar to the former case, impurity ions are doped in the amorphous silicon layer at portions corresponding to the source and drain regions by using the gate electrode as a mask. After metal thin films are deposited in the regions, the amorphous silicon layer is heat-treated and the metal thin films are removed by etching. With this process, the surface of the amorphous silicon surface is changed into a metal silicide to form the source/drain region.

In this manufacturing process, a metal silicide is formed on the surface, of the amorphous silicon layer, in the region doped with the impurity ions, thereby decreasing the resistance of this region. Also in this case, a self-aligned TFT can be formed without impairing the current driving ability of the TFT. Further, satisfactory ohmic contact can be formed between the source region and the source electrode, and between the drain region and the drain electrode. Therefore, an improvement in TFT characteristics and a reduction in parasitic capacitance, which have been subjects in a TFT with a top gate structure using amorphous silicon as an active layer, can be simultaneously attained. Note that a suitable metal for silicidation is Mo, Ti or W.

Arrangement of Light Shield Layer

In the above thin film transistor, a light shield layer consisting of an amorphous silicon carbide layer is preferably arranged below the thin film transistor. In this case, an insulating layer is further arranged between the insulating substrate and the amorphous silicon layer, and the light shield layer is arranged between the insulating substrate and this insulating layer. Alternatively, the light shield layer can be directly arranged between the insulating substrate and the amorphous silicon layer.

It has conventionally been known to use an amorphous silicon layer as a light shield layer. However, since the amorphous silicon layer has a low resistance, and becomes conductive upon light irradiation, the TFT characteristics are influenced; the threshold voltage shifts due to the back gate effect arising from electric charges in the light shield layer. In the present invention, since a silicon carbide film ($SiC_x$) is used as the light shield layer, a high-resistance light shield layer having a photoconductivity two orders of magnitudes or more lower than that of the amorphous silicon layer can be obtained. Although the silicon carbide layer is slightly lower in light shield ability than the amorphous silicon layer because its band gap is wider, a proper layer can be attained by adjusting the content of C.

It is preferable that a semiconductor film forming an active layer be constituted by two layers, amorphous silicon and $SiC_x$ be respectively used for its upper and lower layer portions, and the lower $SiC_x$ layer be used as a light shield layer. If the light shield layer is formed in this manner, even when light is irradiated on the light shield layer, the leakage current from the TFT can be suppressed to a negligible level because of a short lifetime of emission carriers. Therefore, a TFT having high light resistance can be obtained.

Structure of Thin Film Transistor

According to the present invention, there is provided an array substrate using thin film transistors as switching elements, comprising:

an insulating substrate;
amorphous silicon layers formed into an island shape and two-dimensionally arrayed on the insulating substrate, each amorphous silicon layer having a channel region, and source and drain regions formed on two sides of the channel region;
1-st gate dielectric layers formed on the amorphous silicon layers so as to cover the channel regions;
2-nd gate dielectric layers formed on the 1-st gate dielectric layers;
gate electrodes formed on the 2-nd gate dielectric layers;
source electrodes connected to the source regions;
drain electrodes connected to the drain regions;
pixel electrodes two-dimensionally arrayed on the insulating substrate, each pixel electrode being electrically connected to each source electrode;
signal lines formed integrally with the drain electrodes, the signal lines being arrayed between adjacent pixel electrodes; and
scanning lines formed integrally with the gate electrodes, the scanning lines crossing the signal lines, and being arranged above the signal lines via the 2-nd gate dielectric layers.

In the above thin film transistor array substrate, the source and drain electrodes can be arranged either below or above the source and drain regions respectively. The pixel electrode can be arranged either above or below the source and drain electrodes.

When the pixel electrodes are arranged above the source and drain electrodes, an insulating protective layer is deposited to cover the signal lines and the scanning lines, and the pixel electrodes are arranged above this insulating protective layer. The pixel electrodes are electrically connected to the source electrodes through 1-st contact holes formed in the insulating protective layer.

The thin film transistor array having the above structure is manufactured by, e.g., the following process.

Signal lines are arrayed on an insulating substrate. Drain electrodes are formed on the insulating substrate integrally with the signal lines in the same step as that for the signal lines. At the same time, source electrodes are formed on the insulating substrate. Thin film transistors each having the above structure are formed on the drain and source electrodes formed in this manner. Scanning lines are formed integrally with gate electrodes in the same step as that for the gate electrodes. The 2-nd gate dielectric layers are also used as interlevel insulating layers between the scanning and signal lines. An insulating protective layer is deposited to cover the upper surfaces of the insulating substrate, the thin film transistors, and the signal and scanning lines. 1-st contact holes are formed in the insulating protective layer to partially expose the source electrodes. Pixel electrodes are formed in those regions, of the upper surface of the insulating protective layer, that are above the respective regions defined by the signal and scanning lines. The pixel electrodes are connected to the source electrodes through the 1-st contact holes.

In the thin film transistor array having the structure in which the pixel electrodes are arranged above the thin film transistors, the opening ratio of the LCD can be increased.

When the pixel electrodes are arranged above the source and drain electrodes, the thin film transistor array is preferably constituted as follows. That is, lower capacitor electrodes are formed on the insulating substrate in the same step as that for the signal lines. The pixel electrodes are connected to the lower capacitor electrodes through 2-nd contact holes formed in the insulating protective layer to constitute auxiliary capacitors between the lower capacitor electrodes and the scanning lines. In the above structure, each lower capacitor electrode is connected to the source electrode through the pixel electrode. In this manner, since the two electrodes are connected through the pixel electrode consisting of the transparent conductive thin film, the opening ratio of the LCD can be increased.

When the pixel electrodes are arranged above the source and drain electrodes, the thin film transistor array is preferably constituted as follows. That is, the signal lines are formed such that the edge portions of the pixel electrodes overlap the signal lines via the insulating protective layer to make the signal lines function as black matrixes. With this structure, the opening ratio of the LCD can be further increased because no margin for the mask alignment precision is required, compared to a conventional case in which black matrixes are formed independently.

When, however, this structure is simply employed, the coupling capacitance between the pixel electrode and the signal line may increase due to overlapping therebetween. This coupling capacitance may pose a problem such as crosstalk generated on the display of the LCD. To solve this problem, the thin film transistor array is constituted as follows. That is, shield electrodes are arranged above the signal lines through the 2-nd gate dielectric layers. The shield electrodes can be formed integrally with the scanning lines in the same step as that for the scanning lines. The pixel electrodes are formed such that their edge portions overlap the shield electrodes via the insulating protective layer. With this arrangement, the shield electrodes are made to function as black matrixes. At the same time, auxiliary capacitors are constituted between the shield electrodes and the pixel electrodes.

Since the shield electrodes are interposed between the pixel electrodes and the signal lines, the electric field is sealed to prevent variations in potentials of the signal lines from influencing the pixel potentials. In the thin film transistor having the above structure, the shield electrode can be realized by the auxiliary capacitor line formed in the same step as that for the scanning line (i.e., gate electrode), or the scanning line itself of an adjacent pixel. The shield structure can be fabricated without adding a special step. The black matrix structure is desirably formed by making the edge portions of the pixel electrodes overlap the shield electrodes. In this case, it is preferable in terms of the yield that the edge portions of the pixel electrodes be not made to overlap the signal lines.

When the pixel electrodes consist of ITO (Indium Tin Oxide), the insulating protective layer is preferably made of silicon oxide or silicon oxynitride.

Particularly when the edge portions of the pixel electrodes consisting of ITO overlap the signal lines, or when the edge portions of the pixel electrodes consisting of ITO overlap the shield electrodes, dry etching is desirably employed because etching of ITO requires a high processing precision. Known dry etching for ITO is reactive ion etching using hydrogen iodide (HI) gas, hydrogen bromide (HBr) gas, or hydrogen chloride (HCl) gas. If silicon nitride is used for an underlayer, the etching selectivity is only about 3 even with HI gas having the highest selectivity, decreasing the thickness of silicon nitride. However, if silicon oxide or silicon oxynitride is used for the underlayer, and HI is used for the etching gas, a selectivity of about 10 can be obtained. ITO can be dry-etched while suppressing a decrease in thickness of the protective layer to a negligible level.

A thin film transistor array in which the pixel electrodes are arranged above the source and drain electrodes is manufactured by, e.g., the following process.

A transparent conductive thin film (e.g., ITO) is first deposited on an insulating substrate, and a metal thin film is deposited thereon. The metal thin film and the transparent conductive thin film are simultaneously patterned to simultaneously form signal lines stacked on the transparent conductive thin film, drain electrodes integral with the signal lines, and pixel electrodes covered with the metal thin film. Thin film transistors each having the above structure, and scanning lines are formed on the obtained structure. After an insulating protective layer is deposited on the resultant structure, the insulating protective layer in pixel electrode regions is removed by etching. Further, the metal thin film in the regions is removed by etching to form source electrodes. According to the above process, the number of patterning steps required to form a thin film transistor array can be decreased by one.

It is theoretically possible to perform simultaneous processing of the pixel electrode and the signal line in an inverted staggered TFT with a bottom gate structure and a conventional staggered TFT. However, in the inverted staggered TFT, the contact portion between the source and drain regions has a structure in which ITO is connected to an $n^+$ a-Si layer. In this system, good contact characteristics are hard to come. In the conventional staggered TFT, if the surface of the source/drain electrode is a metal film, as described above, the effect of $PH_3$ plasma processing is small, and good contact characteristics are also rarely obtained. To the contrary, in the thin film transistor having the structure of the present invention, since polysilicon formed by laser irradiation is used for a contact layer between the source and drain electrodes, good contact characteristics can be easily obtained, and simultaneous processing of the pixel electrode and the signal line can be put into practical use.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Various embodiments according to the present invention will be described below with reference to the several views of the accompanying drawing.

Embodiment 1

Figure 1:
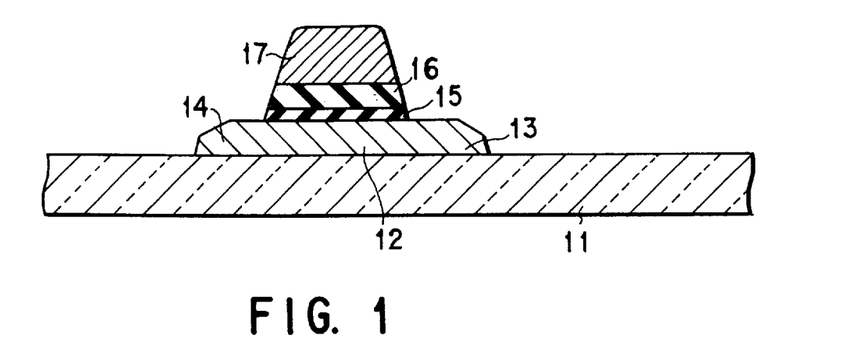
FIG. 1 is a sectional view showing an example of the structure of a thin film transistor according to the present invention.
Figure 2:
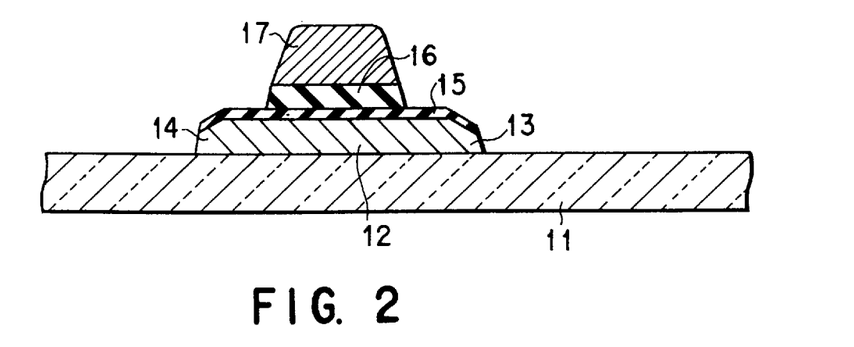
FIG. 2 is a sectional view showing another example of the structure of the thin film transistor according to the present invention.

FIGS. 1 and 2 are sectional views showing examples of the structure of a thin film transistor according to the present invention. The manufacturing processes and structures of these thin film transistors will be described below.

An amorphous silicon layer 12 is deposited to a thickness of 0.1 μm by plasma CVD on one major surface of an insulating substrate 11 made of silica glass (1737 available from Corning Corp.). A silicon nitride layer 15 (1-st gate dielectric layer) is consecutively deposited to a thickness of 0.05 μm by plasma CVD in the same reaction chamber, while maintaining the vacuum state. The amorphous silicon layer 12 is patterned together with the silicon nitride layer 15 thereabove into an island shape by photolithography. A silicon nitride layer 16 (2-nd gate dielectric layer) is deposited to a thickness of 0.35 μm to cover them. Al and Mo are sequentially stacked to thicknesses of 0.3 μm and 0.1 μm on the silicon nitride layer 16, and patterned by photolithography to form a gate electrode 17.

Using the same resist pattern as that used for etching of the gate electrode 17, the silicon nitride layers 16 and 15 are etched to complete the gate dielectric layer. At the same time, amorphous silicon layers 13 and 14 corresponding to portions not covered with the gate electrode 17 are exposed. After peeling the resist pattern, phosphorus (P) is doped in the amorphous silicon layers 13 and 14 by using the gate electrode 17 as a mask. This ion doping is performed by decomposing 5%-$PH_3$ gas diluted with $H_2$ using a plasma, accelerating generated ion species at once by an electric field without performing mass separation, and implanting them into the amorphous silicon layers. If no mass separation is performed in this manner, a large-area substrate can be easily processed.

A XeCl excimer laser beam is irradiated from above the structure. Note that laser irradiation can be performed using an excimer laser of ArF, KrF, XeF, or the like, a YAG laser, an Ar laser, or the like. Since the gate electrode 17 is used as a mask, only the exposed portions, i.e., the P-doped amorphous silicon layers crystallize to activate P, and are converted into low-resistance n-type polysilicon. As a result, the source and drain regions 13 and 14 are formed in self-alignment with the gate electrode. In this manner, the thin film transistor according to the present invention is fabricated.

The thicknesses of the 1-st and 2-nd gate dielectric layers 15 and 16 constituting the gate dielectric layer must be distributed within a proper range. As for the 1-st gate dielectric layer, its lower limit value is about 5 nm in terms of the TFT characteristics, and its upper limit value is about the thickness of the amorphous silicon layer in consideration of the step of patterning the 1-st gate dielectric layer together with the amorphous silicon layer into an island shape, because the shape of a thick layer is difficult to control. On the other hand, the thickness of the 2-nd gate dielectric layer is desirably set to a value equal to or larger than the total thickness of the amorphous silicon layer and the 1-st gate dielectric layer because the 2-nd gate dielectric layer must cover the island-like amorphous silicon layer and 1-st gate dielectric layer.

The 1-st gate dielectric layer 15 need not always be completely removed after patterning the gate electrode 17 if no problem is posed in a subsequent step. That is, etching may be so performed as to partially leave the 1-st gate dielectric layer 15, as shown in FIG. 2.

If Al with a barrier metal stacked thereon is used for the gate electrode 17 in the above manner, the resistance of the gate electrode wiring line (scanning line) can be decreased to enable manufacture of a large LCD. One of purposes for stacking the barrier metal (Mo in this case) on Al is to prevent doping of hydrogen into the channel region in a subsequent ion doping step. If hydrogen is doped in the amorphous silicon layer at the channel portion, the TFT characteristics degrade. Another purpose is to prevent generation of hillocks in Al in a thermal step such as laser irradiation or deposition of an insulating protective layer. Suitable barrier metal materials are W and Ta having high melting points and high densities, in addition to Mo. Of these materials, W is most suitable because it has the maximum melting point and density. The proper thickness range of the barrier metal is 0.03 to 0.2 μm in consideration of the heat resistance, the ion block performance, and the shape controllability in processing the stacked layer.

As for the order of ion doping and laser irradiation, when laser irradiation is performed after ion doping in the above manner, the ion activation ratio increases; when ion doping is performed after laser irradiation, stimulated emission hardly occurs from amorphous silicon upon laser irradiation. Considering the process window in mass production, the latter is preferable. In the latter case, however, the acceleration voltage and the dose must be adjusted so as not to change the polycrystallized source and drain regions into amorphous by ion doping.

Embodiment 2

Figure 3:
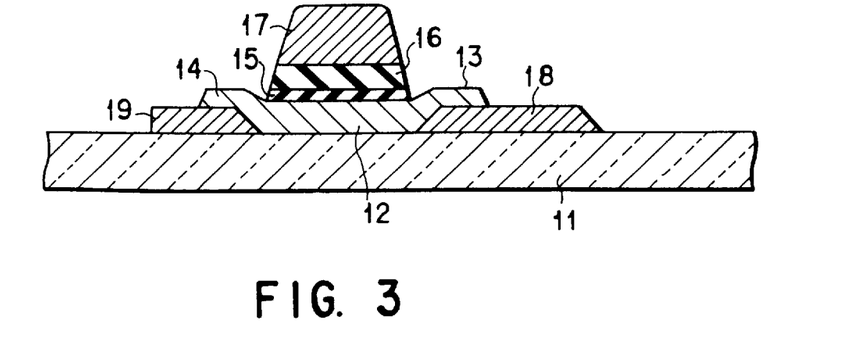
FIG. 3 is a sectional view showing still another example of the structure of the thin film transistor according to the present invention.

FIG. 3 is a sectional view showing an example in which the source and drain electrodes are connected to a thin film transistor having the above structure. In this embodiment, source and drain electrodes 18 and 19 are formed under source and drain regions 13 and 14, respectively.

The structure shown in FIG. 3 is manufactured as follows. An Mo—W alloy is first deposited on one major surface of a glass substrate 11, and patterned by photolithography to form source and drain electrodes 18 and 19. The interval between the two electrodes is set larger than the width (gate length) of a gate electrode 17 to be formed in a subsequent step, and smaller than the width of an island-like amorphous silicon layer to be formed in a subsequent step. A thin film transistor is formed on this structure by the above-described manufacturing process. Ion doping and laser irradiation are performed for the amorphous silicon layer by using the gate electrode 17 as a mask, thereby forming source and drain regions 13 and 14 of the thin film transistor. At the same time, the low-resistance polysilicon layer constituting the source and drain regions 13 and 14 is connected to the underlying source and drain electrodes 18 and 19.

When the source and drain electrodes 18 and 19 are arranged beneath the source and drain regions 13 and 14 in this manner, a dopant (P in this case) must be deeply doped in the thickness direction of an amorphous silicon layer 12. Therefore, the proper acceleration voltage in doping is 50 to 80 keV.

Embodiment 3

Figure 4A:
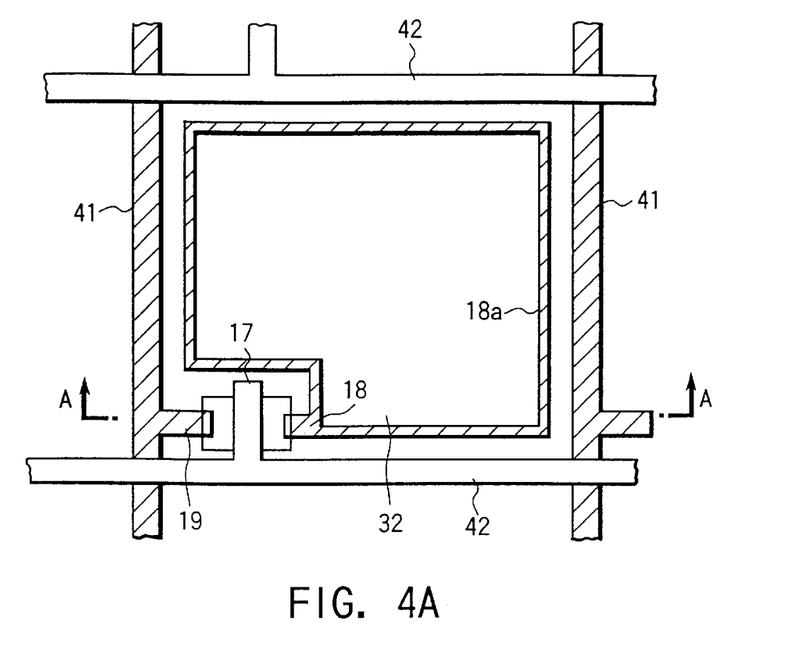
FIG. 4A is a plan view showing an example of the structure of a thin film transistor array according to the present invention.
Figure 4B:
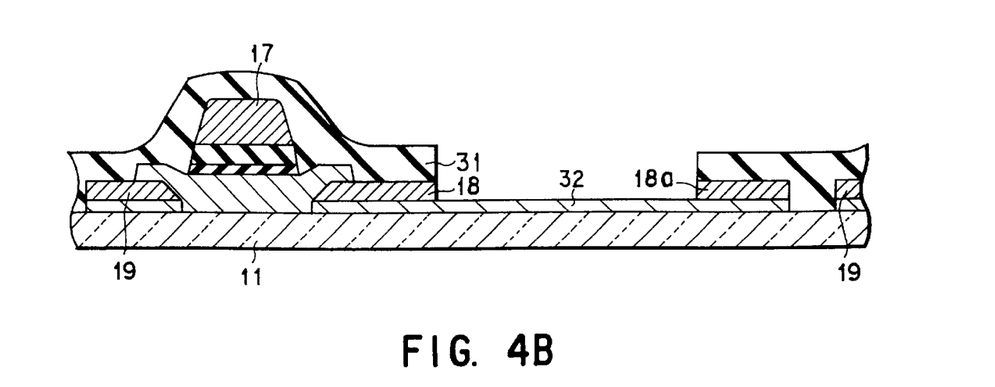
FIG. 4B is a sectional view of the thin film transistor array in FIG. 4A taken along section A—A.

FIGS. 4A and 4B show an example of the structure of a thin film transistor array using the thin film transistor (FIG. 3) of the present invention as a switching element. FIG. 4A is a plan view, and FIG. 4B is a sectional view taken along section A—A. In this embodiment, a pixel electrode 32 is formed below the thin film transistor.

After ITO is deposited on one major surface of a glass substrate 11, and an Mo—W alloy is deposited thereon, the structure is patterned by photolithography to form a drain electrode 19, a signal line 41 integral with the drain electrode, and a pixel electrode 32. The drain electrode 19 and the signal line 41 are formed on the ITO layer, and the upper surface of the pixel electrode 32 is covered with the Mo—W alloy layer in this stage. A thin film transistor is formed on the resultant structure by the above-described manufacturing process (Embodiment 2). A scanning line 42 is formed integrally with the gate electrode 17 at the same time as the gate electrode 17. The entire surface is covered with an insulating protective layer 31 (e.g., silicon nitride), and patterned by photolithography to remove the insulating protective layer above the pixel electrode 32 except for that above the edge portion of the pixel electrode 32 and that above a source electrode 18. The Mo—W film above the pixel electrode 32 is removed by etching except for that above an edge portion 18a and that above the source electrode 18.

In this manner, the thin film transistor array shown in FIGS. 4A and 4B can be obtained. The total number of photolithography masks in the above process is 4.

Embodiment 4

Figure 5A:
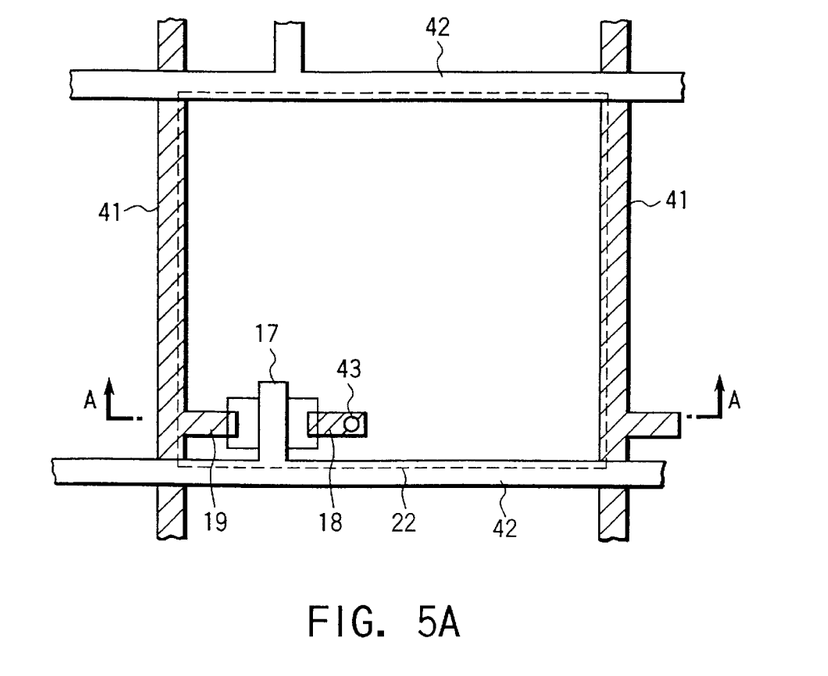
FIG. 5A is a plan view showing another example of the structure of the thin film transistor array according to the present invention.
Figure 5B:
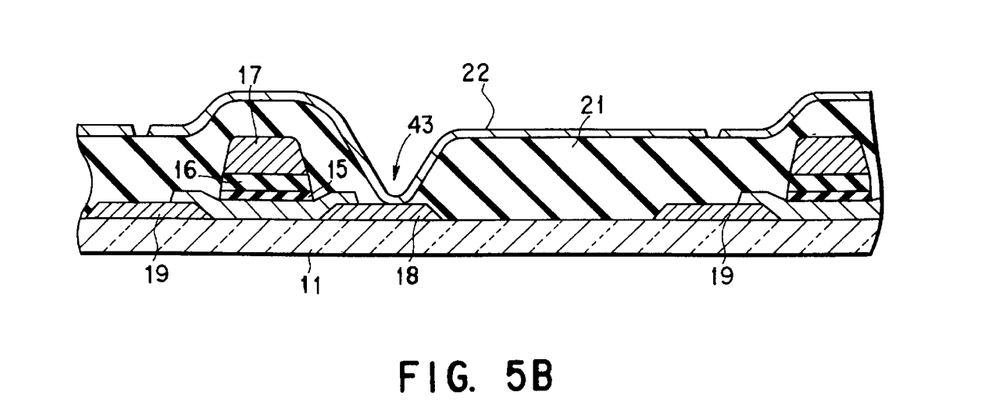
FIG. 5B is a sectional view of the thin film transistor array in FIG. 5A taken along section A—A.

FIGS. 5A and 5B show another example of the structure of the thin film transistor array using the thin film transistor (FIG. 3) of the present invention as a switching element. FIG. 5A is a plan view, and FIG. 5B is a sectional view taken along section A—A. In this embodiment, a pixel electrode 22 is formed above the thin film transistor.

A thin film transistor is first formed on one major surface of a glass substrate 11 by the above-described manufacturing process (Embodiment 2). A signal line 41 is formed integrally with a drain electrode 19 at the same time as the drain electrode, whereas a scanning line 42 is formed integrally with a gate electrode 17 at the same time as the gate electrode. The entire surface is covered with an insulating protective layer 21 consisting of silicon nitride, and patterned by photolithography to form a contact hole 43 (1-st contact hole) and partially expose the surface of a source electrode 18 of the thin film transistor. After ITO is sputtered on the resultant structure, it is patterned to form a pixel electrode 22. The pixel electrode 22 is connected to the source electrode 18 through the contact hole 43 formed in the insulating protective layer 21.

In the TFT array having the above structure, since the signal line 41, the scanning line 42, and the pixel electrode 22 are arranged in separate layers via the 2-nd gate dielectric layer 16 and the insulating protective layer 21, the probability of short-circuiting therebetween decreases. The distance between the signal line 41 and the pixel electrode 22, and the distance between the scanning line 42 and the pixel electrode 22 can be shortened. Therefore, an LCD having a high opening ratio can be manufactured with high yield. The total number of photolithography masks in the above manufacturing process is 5.

Embodiment 5

Figure 6A:
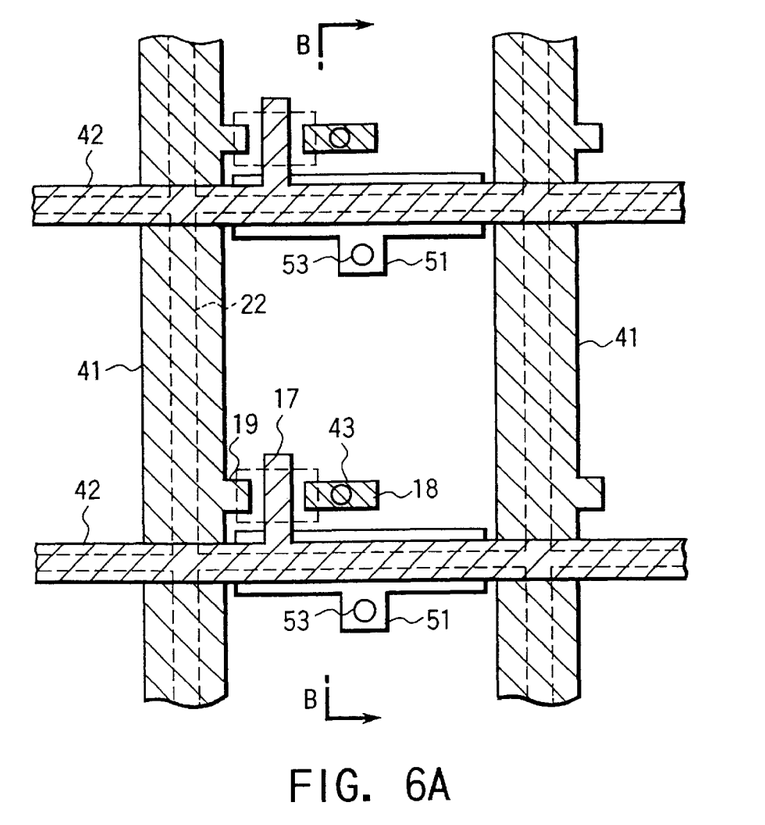
FIG. 6A is a plan view showing still another example of the structure of the thin film transistor array according to the present invention.
Figure 6B:
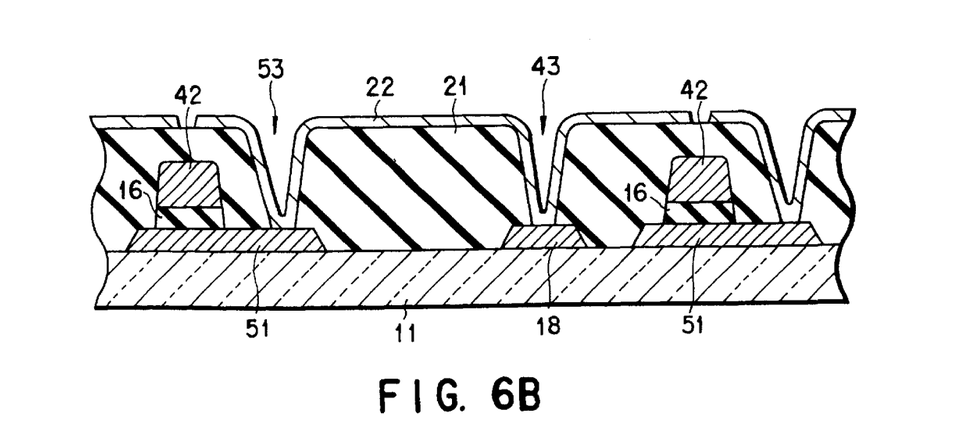
FIG. 6B is a sectional view of the thin film transistor array in FIG. 6A taken along section B—B.

FIGS. 6A and 6B show still another example of the structure of the thin film transistor array using the thin film transistor (FIG. 3) of the present invention as a switching element. FIG. 6A is a plan view, and FIG. 6B is a sectional view taken along section B—B. Also in this embodiment, a pixel electrode 22 is formed above the thin film transistor.

In this embodiment, a lower capacitor electrode 51 is arranged below a scanning line 42 to face the scanning line 42 via the above-described 2-nd gate dielectric layer 16. The remaining structure is the same as that of the TFT array shown in FIGS. 5A and 5B.

In FIGS. 6A and 6B, the lower capacitor electrode 51 for forming an auxiliary capacitor is formed in the same step as that for the signal line 41 and drain and source electrodes 19 and 18. The scanning line 42 of an adjacent pixel also functions as an upper capacitor electrode.

In each pixel, two opening portions, i.e., 1-st and 2-nd contact holes 43 and 53 are formed in an insulating protective layer 21 covering the thin film transistor. The source electrode 18 and the pixel electrode 22 are connected through the 1-st contact hole 43, while the pixel electrode 22 and the lower capacitor electrode 51 are connected through the 2-nd contact hole 53.

The pixel electrode 22 is arranged such that its edge portion overlaps a signal line 41 via the insulating protective layer 21. The signal line 41 serves as a black matrix. By employing this structure, no dedicated black matrix need be arranged on the signal line side. The effective display area can be widened to the boundary portion of the signal line 41, resulting in a large opening ratio of the LCD.

Embodiment 6

Figure 7:
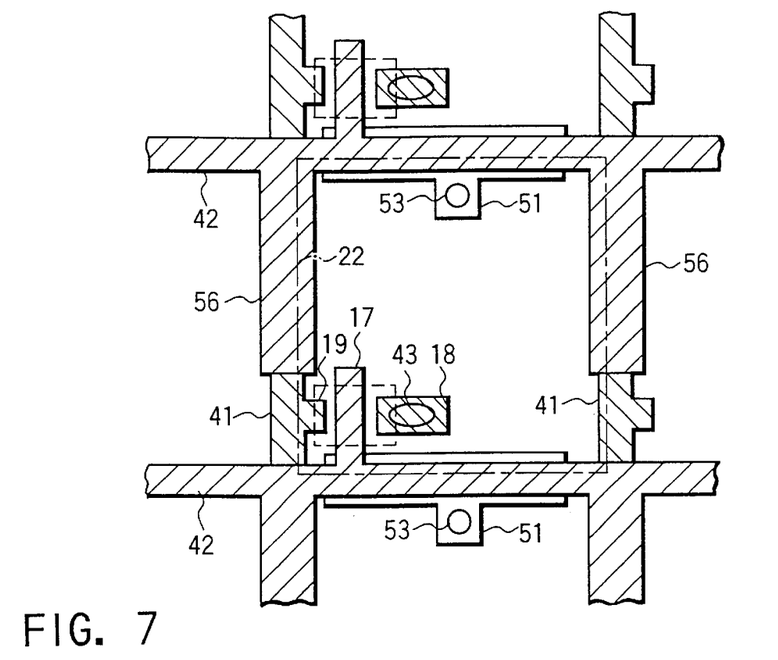
FIG. 7 is a plan view showing still another example of the structure of the thin film transistor array according to the present invention.

FIG. 7 shows still another example (plan view) of the structure of the thin film transistor array using the thin film transistor (FIG. 3) of the present invention as a switching element.

In this embodiment, a shield electrode 56 is arranged above a signal line 41 through the above-described 2-nd gate dielectric layer 16 (FIG. 6B) so as to face the signal line 41. Further, the shield electrode 56 is arranged such that the edge portion of a pixel electrode 22 overlaps the shield electrode 56 via an insulating protective layer 21 (FIG. 6B). The shield electrode 56 is formed integrally with a scanning line 42 at the same time as the scanning line. The remaining structure is the same as that of the TFT array shown in FIGS. 6A and 6B.

In this embodiment, the shield electrode 56 functions as an upper capacitor electrode for forming an auxiliary capacitor, and also as a black matrix because it is arranged to overlap the edge portion of the pixel electrode 22. Further, the shield electrode 56 has the electric field shield effect to prevent variations in potential of the signal line 41 from influencing the pixel electrode 22. Therefore, a degradation in display performance due to coupling between the signal line 41 and the pixel electrode 22 can be prevented, and an LCD having a high opening ratio can be obtained.

In this embodiment, the insulating protective layer 21 consists of silicon oxide, and the pixel electrode 22 is formed by dry-etching ITO with HI.

Embodiment 7

Figure 8:
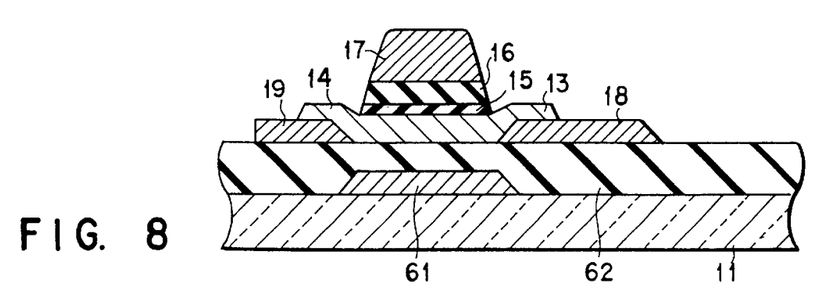
FIG. 8 is a sectional view showing still another example of the structure of the thin film transistor according to the present invention.

FIG. 8 shows an example in which a light shield layer is arranged under the thin film transistor (FIG. 3) of the present invention.

In this embodiment, a light shield layer 61 is arranged on a glass substrate 11, an insulating layer 62 is formed thereon, and a thin film transistor is arranged on the light shield layer 61 via the insulating layer 62.

The light shield layer 61 consists of amorphous silicon carbide ($SiC_x$), and is deposited by plasma CVD, similar to an amorphous silicon layer. The source gas to be used in this process is commonly a gas mixture of $SiH_4$, $CH_4$, and $H_2$. The composition ratio of C/Si in $SiC_x$ is adjusted by adjusting the flow rates of $CH_4$ and $SiH_4$. Since the photoconductivity of the $SiC_x$ layer decreases even with slight doping of C, the band gap of $SiC_x$ is adjusted to be higher than that of amorphous silicon by about 0.05 to 0.20 eV. More specifically, when the band gap of amorphous silicon is 1.75 eV, that of $SiC_x$ is preferably set to about 1.80 to 1.95 eV. The composition ratio of C/Si in $SiC_x$ is about 1 to 10 at %. $SiC_x$ is processed into an island shape so as to shield the light leakage path of the thin film transistor, and covered with an insulating layer consisting of, e.g., silicon nitride or silicon oxide.

Embodiment 8

Figure 9:
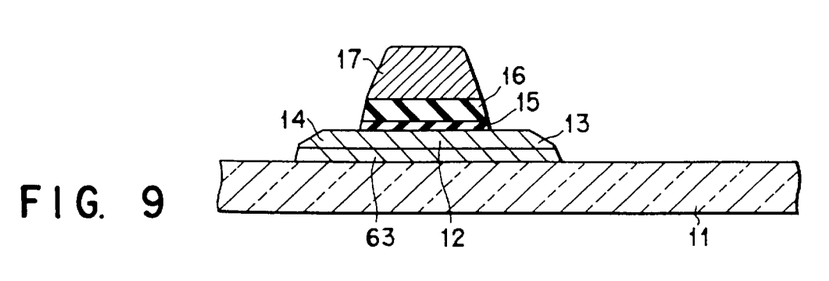
FIG. 9 is a sectional view showing still another example of the structure of the thin film transistor according to the present invention.

FIG. 9 shows another example in which the light shield layer is arranged under the thin film transistor (FIG. 3) of the present invention.

In this embodiment, a light shield layer 63 consisting of amorphous silicon carbide ($SiC_x$) is formed on a glass substrate 11, and a thin film transistor is directly formed on the light shield layer 63. That is, a semiconductor active layer has a double-layered structure of $SiC_x$ and amorphous silicon. Its lower layer side functions as the light shield layer 63. In the upper amorphous silicon layer, a channel region 12 and source and drain regions 13 and 14 of the thin film transistor are formed.

To obtain a clean interface between the $SiC_x$ layer and the amorphous silicon layer, it is preferable to consecutively deposit these layers by plasma CVD while maintaining the vacuum state. More specifically, while maintaining plasma discharge, the $SiC_x$ layer and the amorphous silicon layer are consecutively deposited only by switching source gases (e.g., ON/OFF of $CH_4$ gas). The composition of $SiC_x$ is the same as in the above embodiment (Embodiment 7).

When the amorphous silicon layer is stacked on the $SiC_x$ layer 63 in this manner, the leakage photocurrent of the TFT decreases as the amorphous silicon layer becomes thinner. If, however, the amorphous silicon layer is too thin, the band-warping is influenced by the defect level of the $SiC_x$ layer, decreasing the mobility of the TFT. Therefore, the thickness of the amorphous silicon is set to 10 nm to 50 nm, and particularly to 15 nm to 30 nm.

Embodiment 9

Figure 10:
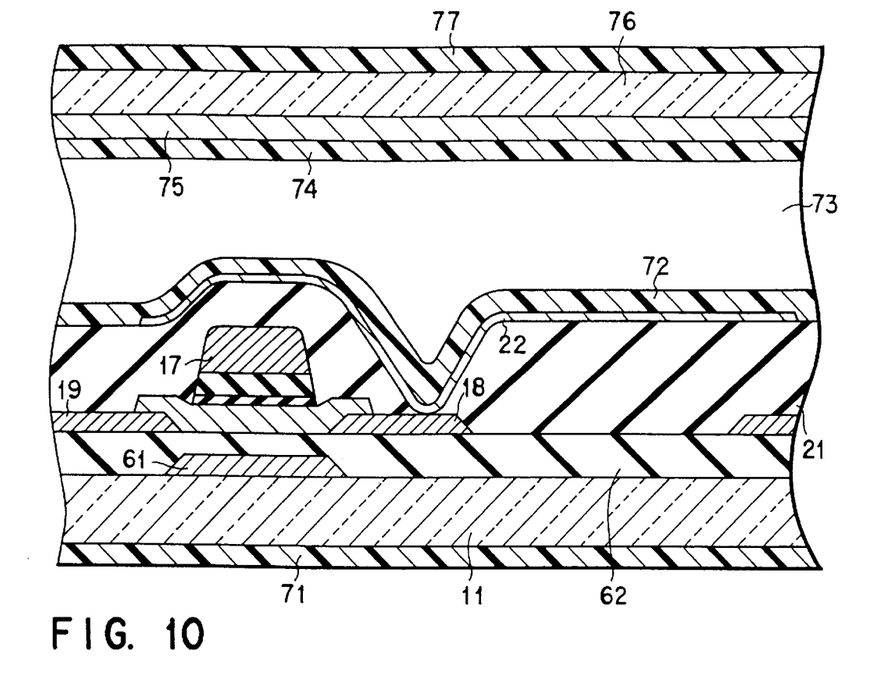
FIG. 10 is a sectional view of a liquid crystal display using the thin film transistor according to the present invention.

FIG. 10 is a sectional view showing a light transmission type liquid crystal display using the thin film transistor (FIG. 3) of the present invention.

A counter substrate is constituted by a glass substrate 76, a counter electrode 75, an orientation film 74, a polarizing filter 77, and others. The counter electrode 75 consisting of ITO is formed on the inner surface of the glass substrate 76. The surface of the counter electrode 75 is covered with the orientation film 74 consisting of a low-temperature-cure polyimide. The polarizing filter 77 is bonded to the outer surface of the glass substrate 76.

An array substrate is constituted by a thin film transistor array (constituted by a glass substrate 11, a gate electrode 17, a source electrode 18, a drain electrode 19, a pixel electrode 22, and others), an orientation film 72, a polarizing filter 71, and the like. The surface of the pixel electrode 22 is covered with the orientation film 72 consisting of a low-temperature-cure polyimide. The polarizing filter 71 is bonded to the outer surface of the glass substrate 11.

The array and counter substrates are arranged to face each other, and a liquid crystal 73 is sealed therebetween. The orientation films 72 and 74 has been rubbed to set their orientation directions perpendicular to each other.

As an insulating protective layer 21 arranged below the pixel electrode 22, a transparent organic insulating layer is used. The coupling capacitance between a signal line 41 (FIG. 5A) and the pixel electrode 22 must be suppressed small because it degrades the display characteristics of the liquid crystal display, as described above. Therefore, a transparent organic insulating layer having a permittivity of 4 or less is desirably applied at a thickness of 1 μm or more. More specifically, the transparent organic insulating layer may be made of an acrylic resin, a polyimide resin, and a benzocyclobutene resin, and the like. If the material has the same photosensitivity as that of a photoresist, the transparent organic insulating layer can be easily processed. To improve the protection function of the TFT, an inorganic insulating layer made of, e.g., silicon nitride is preferably stacked on the organic insulating layer.

It is also possible to color the organic protective layer to form a color filter. In this case, the function of the color filter can be fabricated in the array substrate side, which is effective for manufacturing a high-opening-ratio LCD at low cost.

Embodiment 10

Figure 11:
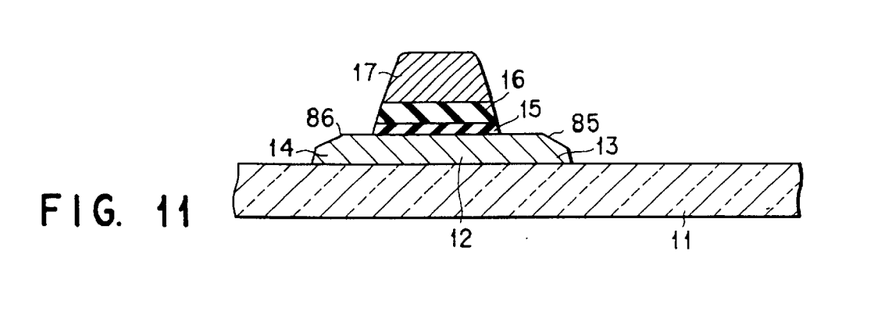
FIG. 11 is a sectional view showing still another example of the structure of the thin film transistor according to the present invention.

FIG. 11 is a sectional view showing still another example of the structure of the thin film transistor according to the present invention.

An amorphous silicon layer 12 is deposited to a thickness of 0.1 μm by plasma CVD on one major surface of an insulating substrate 11 (1737 available from Corning Corp.) made of silica glass. A silicon nitride layer 15 (1-st gate dielectric layer) is consecutively deposited to a thickness of 0.05 μm by plasma CVD in the same reaction chamber, while maintaining the vacuum state. The amorphous silicon layer 12 is patterned together with the silicon nitride layer 15 thereabove into an island shape by photolithography. A silicon nitride layer 16 (2-nd gate dielectric layer) is deposited to a thickness of 0.35 μm to cover them. Al and Mo are sequentially stacked to thicknesses of 0.3 μm and 0.1 μm on the silicon nitride layer 16, and patterned by photolithography to form a gate electrode 17.

Using the same resist pattern as that used for etching of the gate electrode 17, the silicon nitride layers 16 and 15 are etched to complete the gate dielectric layer. At the same time, amorphous silicon layers 85 and 86 corresponding to portions not covered with the gate electrode 17 are exposed. After peeling the resist pattern, P is doped in the amorphous silicon layers by using the gate electrode 17 as a mask.

Mo is sputtered on the exposed amorphous silicon layers and heat-treated at 250° C. to form Mo silicide at the interfaces between the amorphous silicon layers and the Mo layer. Then, the Mo layer is removed by wet etching to leave the Mo silicide on the surfaces of the amorphous silicon layers. As a result, the source and drain regions 85 and 86 are formed in self-alignment with the gate electrode. In this manner, the thin film transistor of the present invention is fabricated.

Embodiment 11

Figure 12:
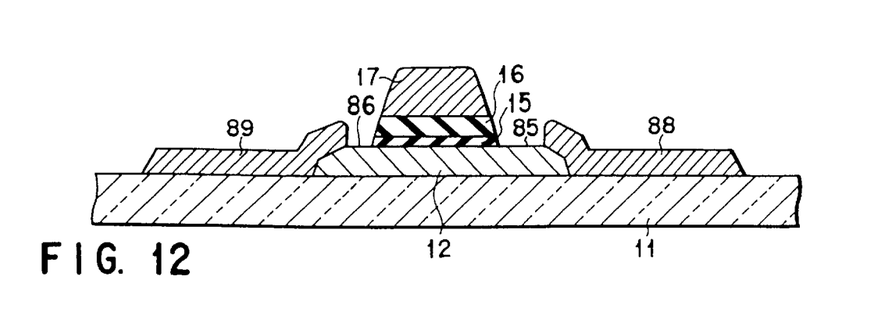
FIG. 12 is a sectional view showing still another example of the structure of the thin film transistor according to the present invention.

FIG. 12 is a sectional view showing an example in which source and drain electrodes 88 and 89 are connected to a thin film transistor having the above structure (FIG. 11).

Connection of the source and drain electrodes 88 and 89 is performed at the same time of formation of source and drain regions 85 and 86 in the final stage of the step of forming a thin film transistor on a glass substrate 11. That is, Mo is sputtered on exposed amorphous silicon layers, and heat-treated at 250° C. to form Mo silicide at the interfaces between the amorphous silicon layers and the Mo layer. The Mo layer is patterned by wet etching to form source and drain electrodes 88 and 89. The interval between the two electrodes is set larger than the width (gate length) of a formed gate electrode 17, and smaller than the width of an amorphous silicon island 12. As a result, when the source and drain regions 85 and 86 are formed in self-alignment with the gate electrode 17, source and drain electrodes 88 and 89 are formed simultaneously.

In the above manufacturing process, Mo silicide is formed on the surface, of the amorphous silicon layer, in an impurity-ion-doped region to decrease the resistance of this region. In this case, a self-aligned TFT can be formed without impairing the current drive ability of the TFT. Further, a good ohmic contact can be realized at the connection portion between the source region 85 and the source electrode 88 and the connection portion between the drain region 86 and the drain electrode 89. A suitable metal for silicidation is Ti or W in addition to Mo.

In the structure and manufacturing process of the thin film transistor according to the present invention, the gate dielectric layer is constituted by the 1-st and 2-nd gate dielectric layers. After the 1-st gate dielectric layer is deposited on the amorphous silicon layer serving as a semiconductor active layer, and the amorphous silicon layer is processed together with the 1-st gate dielectric layer into an island shape, the entire surface is covered with the 2-nd gate dielectric layer. By employing this step, no patterning step is interposed between deposition of the amorphous silicon layer and deposition of the 1-st gate dielectric layer (gate dielectric layer). Therefore, the amorphous silicon layer and the 1-st gate dielectric layer can be consecutively deposited by plasma CVD in the same reactive chamber, while maintaining the vacuum state. As a result, a clean interface can be easily obtained between the amorphous silicon layer and the gate dielectric layer to increase the mobility and reliability of the thin film transistor.

Since the doping element is sufficiently activated due to poly-crystallization by laser irradiation in the source and drain regions formed in self-alignment using the gate electrode as a mask, the resistance is lower than that of n$^+$ a-Si (n-type amorphous silicon) formed by conventional CVD, and a good ohmic contact can be formed between the source/drain region and the source/drain electrode. As a result, an improvement in TFT characteristics and a reduction in parasitic capacitance, which have been subjects in a conventional TFT with a top gate structure using amorphous silicon as an active layer, can be simultaneously attained. If the gate dielectric layer is etched using the same pattern as that for the gate electrode before ion doping to expose the surface of the amorphous silicon layer, ions can be doped into the amorphous silicon layer even at a low acceleration voltage.

According to the thin film transistor manufacturing process of the present invention, the number of masks used in the manufacturing process is 4 or 5 when no light shield layer is arranged, and 5 or 6 when the light shield layer is arranged. The thin film transistor can be manufactured by a smaller number of steps than that of the conventional manufacturing process.

As has been described above, a large LCD can be manufactured at low cost by the thin film transistor manufacturing process of the present invention.

The manufacturing process and structure of the thin film transistor according to the present invention can also be applied to an amorphous silicon contact sensor and the like, in addition to the active matrix liquid crystal display.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A process for manufacturing a thin film transistor comprising the steps of:

depositing a semiconductor layer on a substrate by using a plasma CVD method;

depositing a first gate dielectric layer consecutively to the step of depositing said semiconductor layer by using the plasma CVD method;

patterning said semiconductor layer together with said first gate dielectric layer into an island shape;

depositing a second gate dielectric layer to cover said first gate dielectric layer patterned into the island shape;

depositing a conductive layer over said second gate dielectric layer; and patterning said conductive layer to form a gate electrode.

2. The process according to claim 1, further comprising:

etching said second gate dielectric layer using said gate electrode as a mask.

3. The process according to claim 1, further comprising:

doping said semiconductor layer with an impurity ion using said gate electrode as a mask.

4. The process according to claim 2, further comprising:

doping said semiconductor layer with an impurity ion using said gate electrode as a mask, after etching said second gate dielectric layer.

5. The process according to claim 1, further comprising:

etching said second gate dielectric layer and said first gate dielectric layer using said gate electrode as a mask.

6. The process according to claim 5, further comprising:

doping said semiconductor layer with an impurity ion using said gate electrode as a mask, after etching said second gate dielectric layer and said first gate dielectric layer.

* * * * *